(12) United States Patent
Schwind et al.

(10) Patent No.: US 8,053,725 B2
(45) Date of Patent: Nov. 8, 2011

(54) BEAM QUALITY IN FIB SYSTEMS

(75) Inventors: Gregory A. Schwind, Portland, OR (US); Jonathan H. Orloff, Rockaway Beach, OR (US)

(73) Assignee: FEI Company, Hillsboro, OR (US)

( * ) Notice: Subject to any disclaimer, the term of this patent is extended or adjusted under 35 U.S.C. 154(b) by 323 days.

(21) Appl. No.: 12/494,024

(22) Filed: Jun. 29, 2009

(65) Prior Publication Data
US 2010/0327180 A1     Dec. 30, 2010

(51) Int. Cl.
*H01J 37/05* (2006.01)
*H01J 37/147* (2006.01)
*H01J 37/305* (2006.01)

(52) U.S. Cl. ... 250/309; 250/305; 250/307; 250/492.21; 250/398

(58) Field of Classification Search ............... 250/305, 250/309, 307, 492.21, 492.3
See application file for complete search history.

(56) References Cited

U.S. PATENT DOCUMENTS

| | | |
|---|---|---|
| 5,448,063 A | 9/1995 | De Jong et al. |
| 5,539,203 A | 7/1996 | Ohdomari |
| 5,838,011 A | 11/1998 | Krijn et al. |
| 5,986,269 A | 11/1999 | Krijn et al. |
| 6,191,423 B1 | 2/2001 | Krijn et al. |
| 6,246,058 B1 | 6/2001 | Tiemeijer |
| 6,410,924 B1 | 6/2002 | Wang |
| 6,501,076 B1 | 12/2002 | Kelly et al. |
| 7,378,667 B2 | 5/2008 | Henstra |
| 2003/0143327 A1 | 7/2003 | Schlaf et al. |
| 2008/0290264 A1 | 11/2008 | Henstra et al. |
| 2009/0289195 A1 | 11/2009 | Henstra |
| 2010/0187436 A1* | 7/2010 | Frosien et al. ............... 250/424 |

FOREIGN PATENT DOCUMENTS

| | | | |
|---|---|---|---|
| EP | 2211366 A1 * | 7/2010 | |
| JP | 61188843 | 8/1986 | |
| WO | 0153891 | 12/2000 | |
| WO | WO 0153891 A1 * | 7/2001 | |

OTHER PUBLICATIONS

Meingailis, John, 'Focused Ion Beam Technology and Applications,' J. Vac. Sci. Technol. B, Mar./Apr. 1987, pp. 469-495, vol. 5, No. 2.
Schwind, Greg, et al., "Emission Characters of Au60Be40 and Au62Si23Be15 Liquid Metal Ion Sources," J. Vac. Sci. Technol. B, Nov./Dec. 2007, pp. 2586-2592, vol. 25, Iss. 6.
Simpson, J. Arol, "Design of Retarding Field Energy Analyzers," The Review of Scientific Instruments, Dec. 1961, pp. 1283-1293, vol. 32, No. 12.

* cited by examiner

*Primary Examiner* — Jack Berman
(74) *Attorney, Agent, or Firm* — Scheinberg & Griner, LLP; Michael O. Scheinberg; David Griner

(57) ABSTRACT

Applicants have found that the asymmetrical energy distribution of ions from an ion source allow chromatic aberration to be reduced by filtering ions in the low energy beam tail without significantly reducing processing time. A preferred embodiment includes within an ion beam column a filter that removes the low energy ions from the beam.

19 Claims, 7 Drawing Sheets

BEAM QUALITY IN FIB SYSTEMS

TECHNICAL FIELD OF THE INVENTION

The present invention relates to an improved particle beam device, such as a focused ion beam (FIB), and more particularly to an energy filter for improving beam quality and milling quality in such a device.

BACKGROUND OF THE INVENTION

In focused ion beam (FIB) systems, ions are extracted from a source, formed into a beam, focused, and scanned across a substrate to form an image of a feature, to mill a feature or to deposit material from a gas ambient. As features become increasingly small, the FIB system must be optimized to provide a higher quality beam, that is, a smaller, more focused beam spot in which the distribution of current should be as compact as possible.

Several factors reduce the quality of the current distribution of the FIB. For ion columns using a liquid metal ion source (LMIS), a primary cause of reduced beam quality at low to moderate beam current is chromatic aberration. Gallium ions emitted from a liquid metal ion source have an energy distribution which is a combination of the intrinsic and particle interactions; the latter component is commonly referred to the as the Boersch affect. The former is very complicated as there are several different mechanisms to form the ions. Chromatic aberration is the result of particles of different energies being focused at different locations by the lenses in the ion column. The chromatic aberration causes the beam current distribution to vary with the energy spread ($\Delta E$) of the ions. If the energies of the ions in an ion beam were plotted on a histogram showing the frequency of occurrence of ions at each energy value, the graph would have a peak at a "nominal" energy value, decrease rapidly for energies above and below the peak, and then taper off more slowly. The regions where the graph tapers off are known as the beam "tail." The energy spread, $\Delta E$, is typically measured as the "full width, half maximum," that is, the energy between points at half the maximum peak value on either side of the peak. In a typical gallium liquid metal ion source, the energy spread in the beam having a current of 1 pA to several hundred nA is typically about 5 eV at an emission current of 1.5 to 2.5 µA from the source.

FIGS. 1A-1C are photomicrographs that show the effects of the beam energy tail on ion beam milling of photoresist. The features shown in FIGS. 1A-1C were milled using a gold-silicon ion source, with a beam current of 0.2 nA. In FIG. 1A, the beam was applied for two seconds to provide a dose of $4 \times 10^4$ ions per cm$^2$. The beam was moved in a square pattern to mill a central square 100. The ions in the energy tail, having energies away from the peak were deflected differently in the ion column and fell outside the square, milling the photoresist lightly out to circle 102.

In FIG. 1B, the beam was applied for 10 seconds for a total ion dose of $2 \times 10^{15}$ ions per cm$^2$. The relative number of ions having a particular energy value decreases as the particular energy value is farther from the nominal beam value. That is, the number of ions gets smaller as the energy value gets farther from the nominal value. As the total number of ions is increased, however, ions having energies farther from the nominal value will also increase in number. The longer the milling operation, the more the effects of ions further in the energy tail will be seen. The circle 102 is wider in FIG. 1B than in FIG. 1A because ions further in the tail from the nominal value are having an increased effect because of their increased number. In FIG. 1C, the beam was applied for 100 seconds for a total ion dose of $2 \times 10^{16}$ ions per cm$^2$, and the circle 102 is even wider as the number of ions further away from the nominal energy value increases and the effects are more visible.

Monochromators are sometimes used to reduce the energy spread of electron beams. Monochromators are designed to truncate a symmetrical Gaussian-shaped energy distribution of the electrons in the beam by removing electrons having energies that diverge from the average energy by more than a specified amount. Monochromators are complex and typically greatly reduced beam current. Monochromators are therefore not employed in FIB systems used for charged particle beam milling and deposition in commercial applications.

SUMMARY OF THE INVENTION

An object of the invention is to provide a system and method to enhance the beam quality for milling of a liquid metal ion beam by eliminating the low energy tail of the beam. Applicants have found that a small number of ions having energy significantly lower than the nominal beam energy contribute disproportionately to the degradation in quality of an ion beam. By using a relatively simple high-pass energy filter, applicants improve the quality of the beam with an unexpectedly small decrease in beam current.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 2:
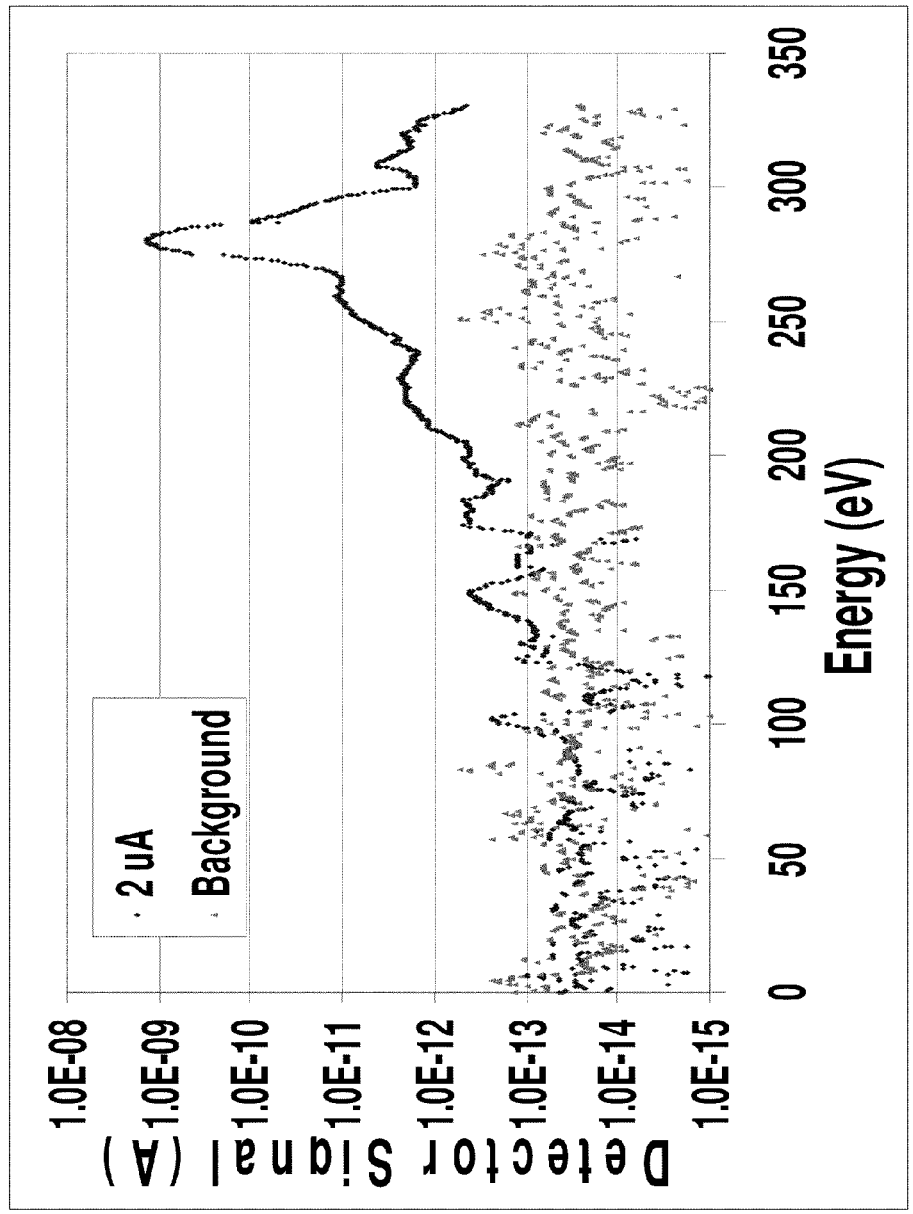
FIG. 2 is a graph showing the energy distribution of ions from a liquid metal ion source.
Figure 3:
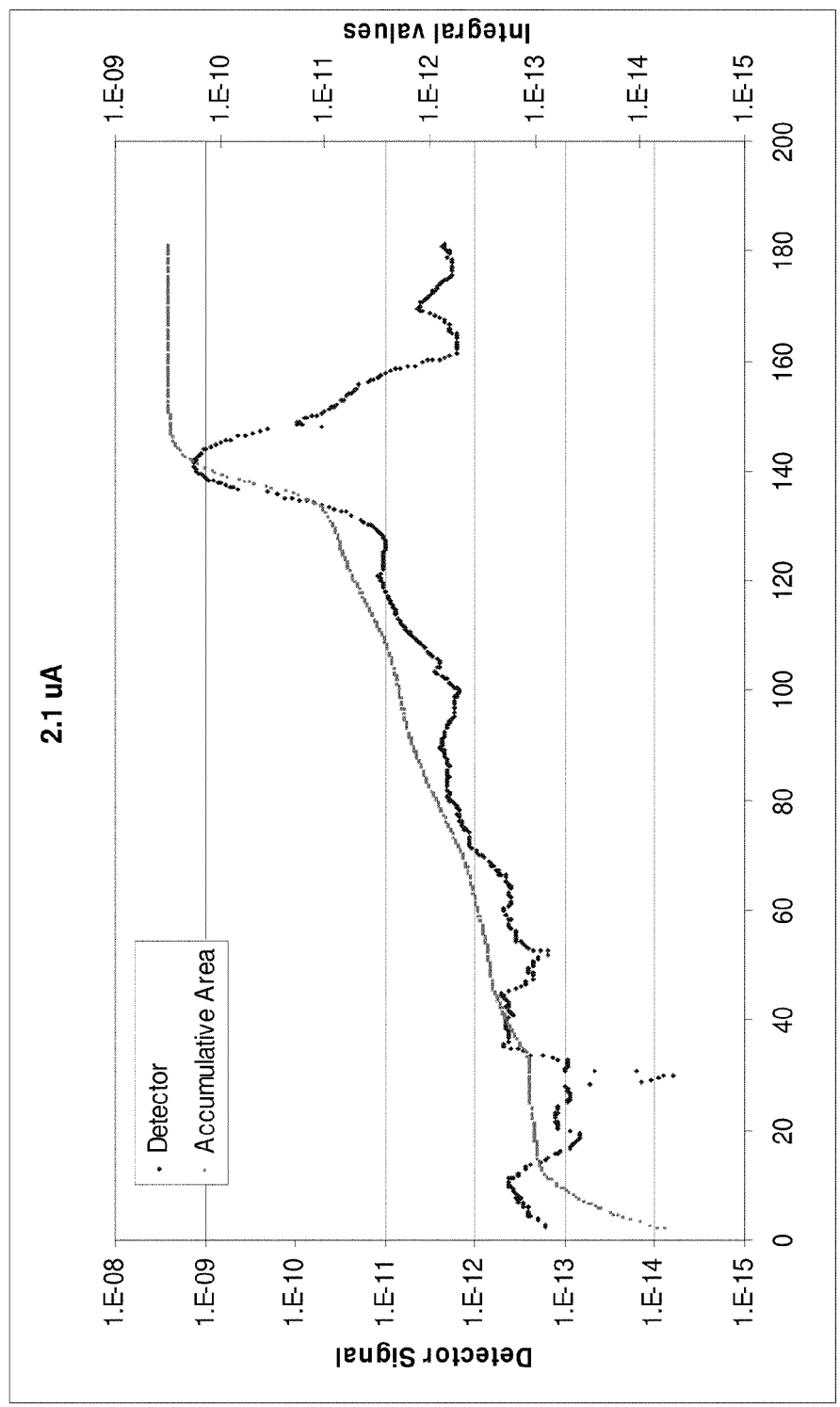
FIG. 3 is a graph using the data of FIG. 2, but with the x-axis converted to an energy scale with arbitrary positioning of zero and showing the accumulated area under the curve.

Applicants measured the energy values of ions in an ion beam to determine their energy distribution. FIG. 2 shows a graph of a detector signal versus ion energy for a beam of monoisotopic, singly charged gallium ions in 2 µA ion beam. The energies of the ions were measured using a mass spectrometer. Because the mass and charge of the monoisotopic gallium ions is known, the mass spectrometer system could be used to determine the energy of the ions. Grey dots show the background noise of the detector with no extraction voltage on the source. FIG. 2 shows that the gallium tail appears to extend about 150 eV below the peak energy value about 275 V. FIG. 3 shows the same data as FIG. 2, but with the zero energy arbitrarily repositioned on the x-axis and with another curve showing the cumulative area under the energy curve to provide another visual representation of the energy spread. From FIG. 3, it appears that the energy tail extends for at least about 100 eV to the low energy side.

Figure 4:
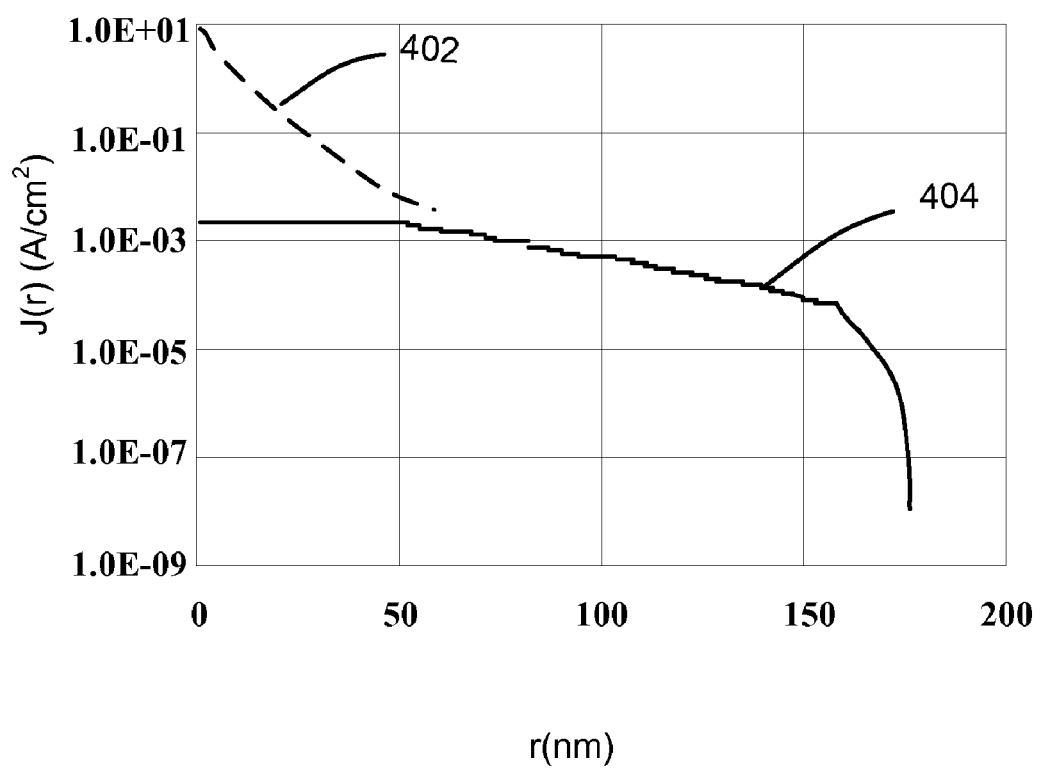
FIG. 4 shows the calculated beam spot size based on chromatic aberration calculations using the energy spread shown in FIGS. 2 and 3.

This spread in ion energy will affect the ability of the column optics to focus the beam, particularly the low energy beam tail. FIG. 4 shows the calculated beam spot size based on chromatic aberration calculations using the ion energy distribution shown in FIGS. 2 and 3. Dashed line 402 shows the spot diameter of the central beam assuming a Gaussian distribution of energy, and solid line 404 shows the spot size due to the long low energy tail. Line 404 shows that the spot size increases out to 150 nm.

Figure 1A:
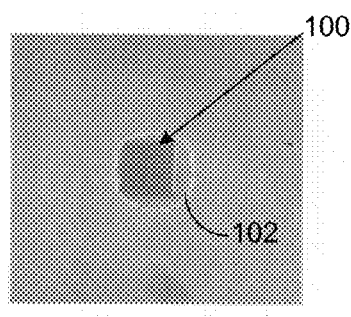
FIGS. 1A-1C are photomicrographs showing the effects of the beam energy tail.
Figure 1B:
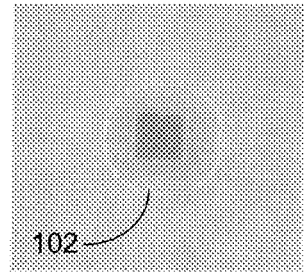
Figure 1C:
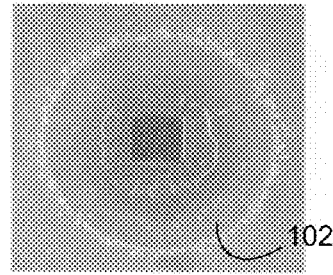

Elimination of the low energy beam tail would improve the beam quality and reduce undesirable artifacts, such as the circles shown in FIGS. 1A-1C. Improved beam quality would improve the quality of milled and deposited features. Elimination of the beam tail would simplify ion beam processing by eliminating clean-up steps, allow the milling and deposition of smaller structures, and generally increasing the ease of use of the FIB system.

By discovering that the beam tail extends to such a large extent in the low energy direction, applicants are able to significantly reduce the energy spread by eliminating the low energy beam tail, which only minimally reduces the useful beam current. Because ions in the low energy beam tail did not impact near the ions having energy near the nominal energy value, they do not contribute to the processing speed, and so reduction of the tail in some embodiments has a minimal impact on milling speed or signal to noise ratio in imaging. In a typical gallium liquid metal ion source, applicants have found that only between about 2% and 3.3% of current is in the low energy tail.

The low energy beam tail can be eliminated using a simple high-pass filter to improve the beam quality to a significant extent while minimally reducing beam current. "High-pass filter" is used to include any energy filter that preferentially filters out ions in the low energy beam tail. In the context of the present invention, a high-pass filter could pass all ions above a particular energy; it could be a band pass filter having the pass band centered above the peak energy value, so that it passes ions having energies above the peak value while blocking the energy tail; it could be a band pass filter centered on the peak value, but having a pass band sufficiently wide that, because of the asymmetry of the ion energy distribution, it blocks primarily ions in the low energy beam tail, while passing essentially all ions having energies above the peak value.

Figure 5:
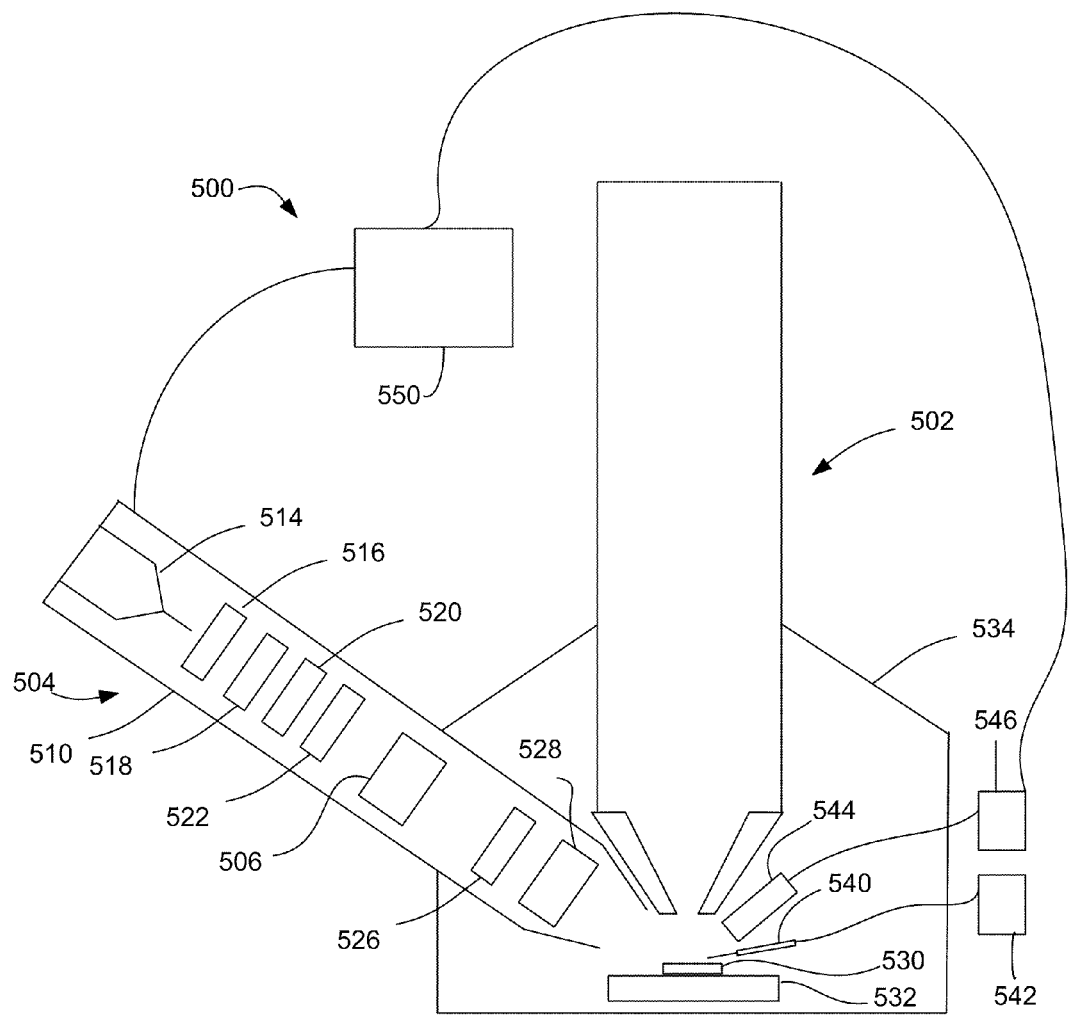
FIG. 5 shows a dual beam system incorporating a high-pass energy filter in the ion beam column.

FIG. 5 shows a dual beam system 500 including a scanning electron microscope column 502 and an ion beam column 504 that includes a high-pass energy filter 506 for eliminating the low energy beam tail. Any known type of high-pass energy filter can be used. Ion beam column 504 includes an evacuated envelope 510 within which are located an ion source 514, extractor optics 516, a first lens 518, a beam blanker 520, a variable aperture 522, high-pass energy filter 506, beam scanning deflectors 526, and a final lens 528. Ions from source 514 are extracted and formed into a beam by extractor optics 516 and are focused by first lens 518. Variable aperture 522 defines the beam diameter and current, and high-pass energy filter 506 removes the low energy ions in the beam tail. Beam deflectors 526 scan the beam, focused onto the work piece 530 by final lens 528, in a desired pattern on the surface of work piece 530, which may comprise, for example, a semiconductor device positioned on movable X-Y stage 532 within a lower vacuum chamber 534. A gas injector 540 is connected to a supply of process gas 542 to provide a process gas for beam-assisted etching or deposition and a secondary particle detector 544 detects secondary particles for forming an image on a video monitor 546. A controller 550, such as a computer, controls the operation of dual beam system 500.

The ion source 514 is typically a liquid metal ion source that provides a beam of gallium ions, although other ion sources, such as a multicusp or other plasma ion source, can be used, employing for example, oxygen, argon or another noble gas for ions. The ion source 514 typically is capable of being focused into a sub-one-tenth micron wide beam at work piece 530 for either modifying the work piece 530 by ion milling, chemically-enhanced etch, material deposition, or for the purpose of imaging the work piece 530. Rather than focusing the beam to a point, the ion column may also provide a shaped beam. Shaped beams can provide larger beam currents to reduce sputtering time.

Skilled persons will recognize that there are many possible configurations for a focused ion beam system, and the invention is not limited to any particular focused ion beam system. For example, a single focusing lens can be used or deflectors 526 may be positioned below final lens 528.

High-pass energy filter 506 is preferably an electrostatic filter because electrostatic deflection is independent of mass in the non-relativistic limit. Gallium naturally occurs in two isotopes, gallium 69 and gallium 71, and an electrostatic deflector will deflect both by the same amount. A magnetic filter can also be used, but is less preferred because it will provide a different trajectory for the different isotopes of gallium. If a magnetic high-pass filter is used, either monoisotopic gallium should be used or an additional magnetic deflector should be provided to reintegrate the beams of gallium of different masses. A magnetic filter may also require shielding so that the magnetic field does not affect the trajectory of the ions in other parts of the focusing column. Whatever type of filter is used, it preferably also eliminates neutral gallium atoms in the beam, thereby further improving performance.

Figure 6:
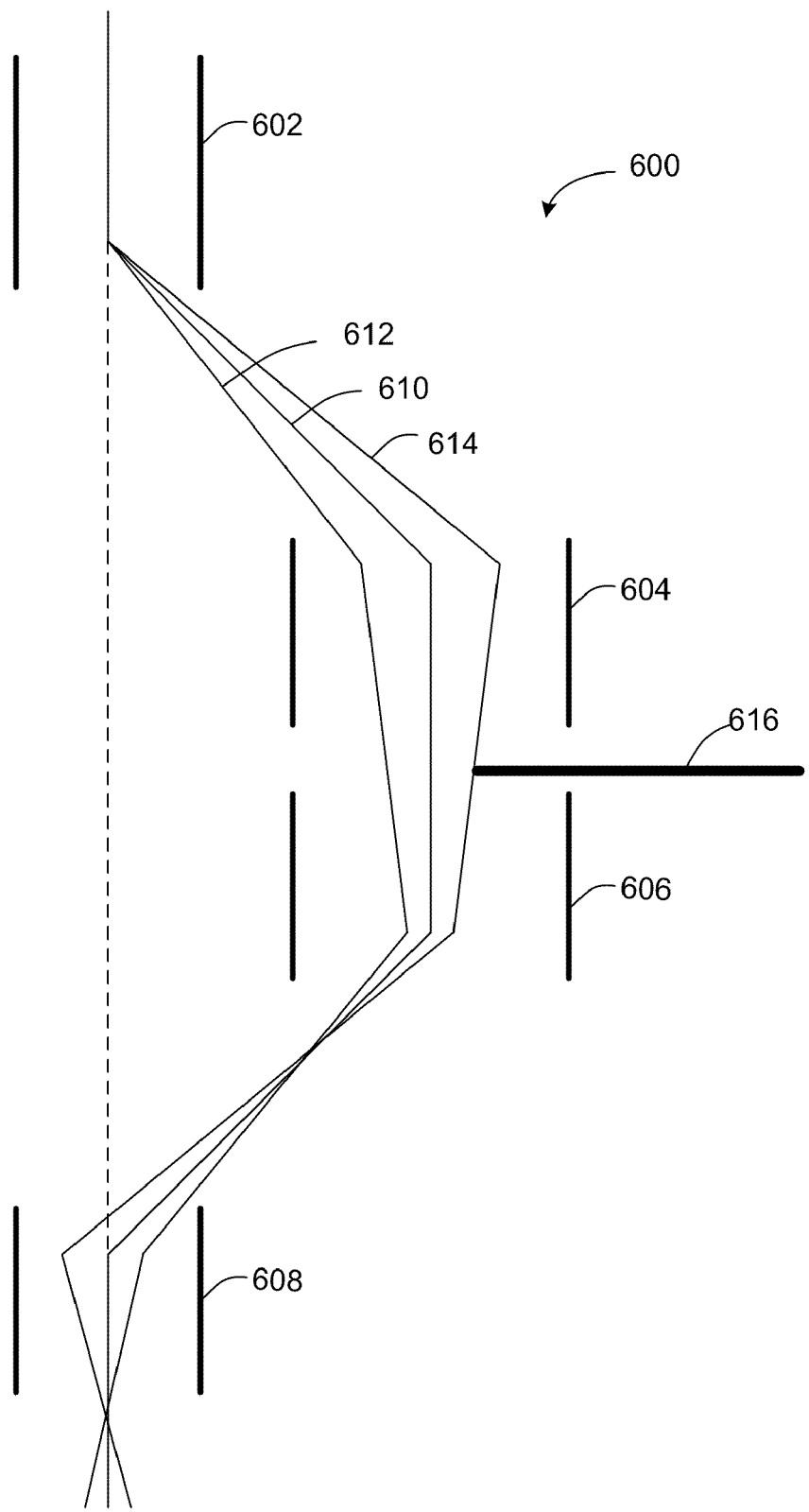
FIG. 6 shows an embodiment of a preferred high-pass energy filter.

FIG. 6 shows a preferred electrostatic filter. Filter 600 includes four sets of deflectors, deflectors 602, deflectors 604, deflectors 606, and deflectors 608. Ions of all energy levels enter deflector 602 along its optical axis. Higher energy ions move faster and spend less time in the deflection field between the deflectors, so they are deflected slightly less than ions having lower energy. FIG. 6 shows trajectories of ions having three representative energy levels: a first trajectory 610 for ions having a nominal energy qV, and a second trajectory 612 for ions having energy q(V+dV), and a third trajectory 614 for ions having an energy of q(V−dV).

Deflector 604 deflects ions having energy qV back onto a trajectory that is essentially parallel to the original trajectory as shown by trajectory 610. Ions having energies of q(V+dV), being deflected less, are deflected to trajectory 612 that is not quite parallel to the original trajectory. Ion having energy less than q(V−dV), being deflected more, are deflected to trajectory 614 that is not quite parallel to the original trajectory, and are deflected just enough to clear a barrier 616. Ions having energy of less than q(V−dV) are not deflected enough to clear barrier 616, and so they hit the barrier and are not transmitted through the filter.

Filter 600 is a "high-pass" filter because ions having energy greater than q(V−dV) can pass through the filter, but ions having energy less than q(V−dV) do not pass through the filter. The energy of ions that are passed can be adjusted by moving the barrier 616 closer or further from the optical axis or by changing the deflection voltages.

Barrier 616 will be damaged by the impact of the ions, so the filter is preferably positioned close to the source where the ion energy is relatively low to reduce sputtering, and barrier 616 is preferably composed of a material, such as carbon or tungsten, that is resistant to sputtering.

Deflector 606 deflects the ions back toward the deflector 608, which deflects the ions back onto a trajectory that is essentially parallel to the trajectory of the ions before they entered the filter 600. Ions having energies slightly different from qV will end up with trajectories that are not quite parallel to the original trajectory, and the filter 600 may cause astigmatism of the beam, which can be corrected, if necessary, using known techniques, such as an octupole lens. While deflectors 602, 604, 606, and 608 are shown as simple parallel plates, any type of deflector, such as quadrapoles, sextupoles, or octupoles can be used.

For example, in one preferred embodiment, the nominal ion energy is 30 keV and the ion voltages on the deflectors 602, 604, 606, and 608 are typically in the range of 0-250V, respectively. The optimum positioning of barrier 616 can be readily determined experimentally for any particular application by observing the change in ion current and observing the milling results on a surface as the position of barrier 616 is moved towards or away from the optical axis. Barrier 616 is preferably positioned sufficiently close to the optical axis to reduce or eliminate the effects of the beam energy tail, while minimally reducing overall current.

Figure 7:
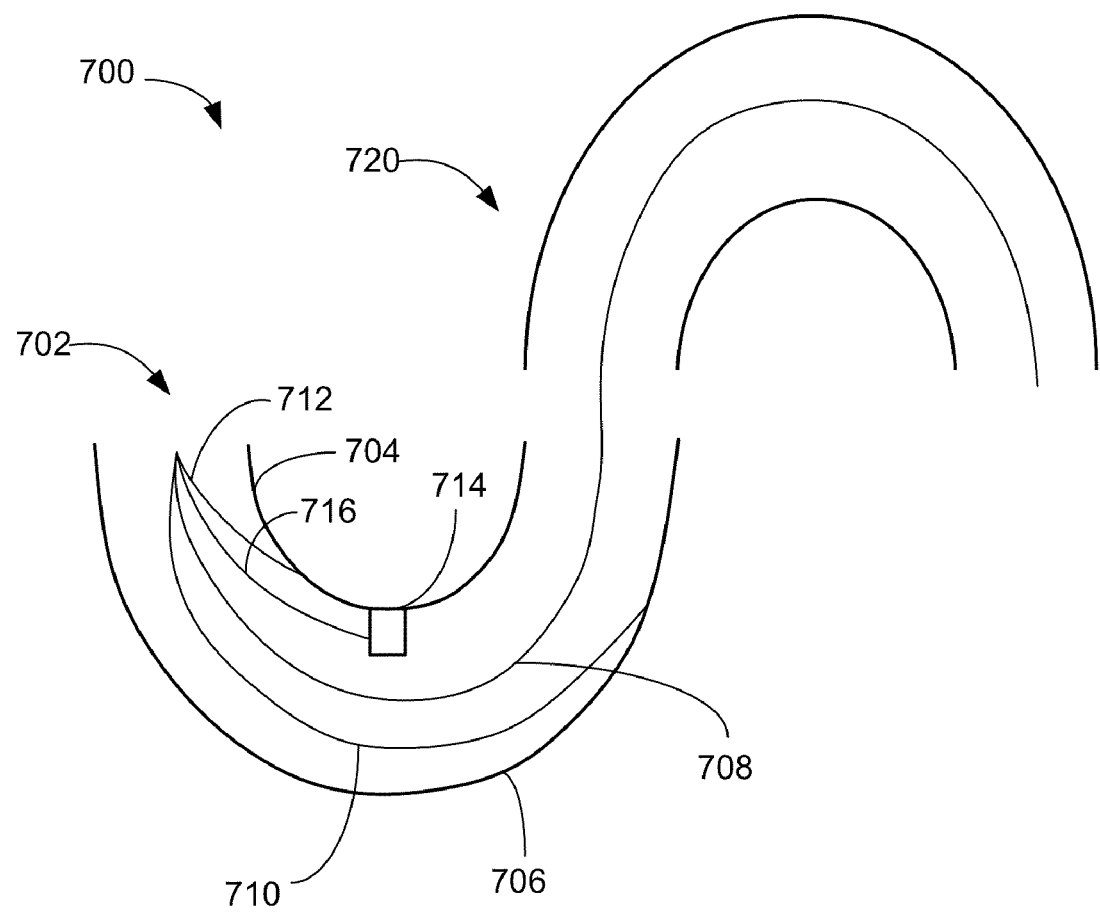
FIG. 7 shows an alternate embodiment of a high-pass energy filter.

FIG. 7 shows another design for a high-pass filter 700. The high-pass filter of FIG. 7 is based on uses a hemispherical capacitor, which is described, for example, in "Design of Retarding Fields Energy Analyzers" *The Review of Scientific Instruments*, Vol. 32, No. 12 (1961 pp 1283-93). High-pass filter 700 includes a first hemispherical filter 702 having an inner hemispherical conductor 704 and an outer hemispherical conductor 706. An electric potential difference is maintained between the inner and outer hemispherical conductors. The field between the conductors causes charged particles to curve within the filter and only particles within an energy band will pass through the filter.

Charged particles having energies within the pass band will follow a trajectory such as trajectory 708. Charged particles having energies greater than high end of the energy pass band would follow a trajectory such as trajectory 710 and spiral into the outer hemispherical conductor 706. Charged particles having energies below the energy pass band will follow a trajectory such as trajectory 712 and spiral into the inner hemispherical conductor 704. Within first hemispherical filter 702 is a particle blocker 714 that can be used to block particles that would other wise pass through the hemispherical filter 702, thereby asymmetrically altering the pass band to preferentially block ions having energies that are a specified amount below the peak energy value. Trajectory 716 shows the path of an ion that would have passed through filter 702 had it not been blocked by particle blocker 714.

The first hemispherical filter 702 could be tuned so that ions having energies within a broad range centered about the energy peak of an ion beam would pass through the filter. Thus, in the absence of particle blocker 714, the filter would pass essentially all of the ions in the beam. Particle blocker 714 then blocks ions having energies below a specified value to eliminate the low energy ion tail. That is, the pass band of the hemispherical filter 702 is very broad, and the blocker 714 essentially turns the hemispherical filter 702 into a high-pass filter by preferentially blocking low energy ions. In an alternative embodiment that does not require a particle blocker 714, the hemispherical filter 702 can be tuned so that the center of the pass band is well above the energy peak of the beam. The filter can thus block off the tail of low energy ions, which will be outside of the pass band, while passing essentially all ions above the energy peak of the beam. In yet another embodiment, the energy pass band of the filter is essentially centered on the beam peak energy value, with the band wide enough to pass essentially all ions above the beam peak energy, blocking only the extended beam tail at lower energies. While such a filter is not technically a high-pass filter, it will be within the definition of a high-pass filter as used herein because it blocks more low energy ions than high energy ions, preferably passing essentially all of the ions in the beam above the energy peak value, while blocking the low energy tail.

When the charged particles leave first hemispherical filter 702, they are moving in the opposite direction of the direction in which they entered filter 702. A second hemispherical capacitor 720 can be used to change the direction of the charged particles back to the direction in which the ions were originally moving. The second hemispherical filter can also be used as a filter. The voltages on the hemispherical filters for a particular nominal beam energy can be readily determined by skilled persons.

The preferred ion energy passed by the filter in the various embodiments of the invention will depend on the application. For example, for gross machining, it will be desired to pass more ions and the chromatic aberration will be less important. For fine micromachining, the pass energy may be set closer to the nominal value. For example, in some embodiments, the pass energy may be set to be 2.5 eV, 3 eV, 4 eV, 5 eV, 6 eV, 10 eV, 25 eV, 50 eV, or 75 eV below the nominal beam energy. That is, the filter is preferably set to block ions having energies less than the peak value minus 2.5 eV, 3 eV, 4 eV, 5 eV, 6 eV, 10 eV, 25 eV, 50 eV, or 75 eV.

Because of the low energy beam tail, the high pass filter preferably blocks more ions having energies below the peak value than ions having energies above the peak value. In some embodiments, a high-pass filter may filter out more than 1%, more than 2%, or more than 3% of ions below the beam energy peak while blocking less than 2%, less than 1%, less that 0.5%, or less than 0.25% of ions having energies above the peak value. Various embodiments may use any combination of the recited values for blocking low energy ions and passing high energy ions. For example, the filter may block more than 1% of ions having energies below the nominal value and less than 0.5% of the ions having energies above the nominal value. In some embodiments, the high-pass filter may block ions in the beam having less than a specified energy and passing essentially all ions having energies greater than the specified energy, the specified value being below the peak energy value of ion beam. In some preferred embodiments, the high-pass filter blocks more than 1%, more than 2%, or more than 3% of the total number of ions in the beam.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A focused ion beam system for processing a sample, comprising:
    a source of ions; an extractor electrode for extracting ions from the source and forming the ions into a beam;
    a high-pass filter for blocking ions in the beam having less than a specified energy and passing essentially all ions having energies greater than the specified energy, the specified value being below the peak energy value of the ion beam;
    a deflector for positioning the ion beam on the sample; and
    a focusing lens for focusing the ions onto a submicron spot on the sample.

2. The focused ion beam system of claim 1 in which the high-pass filter is configured to remove ions having energies of less than the energy value of the energy peak of the beam minus 4 eV.

3. The focused ion beam system of claim 1 in which the high-pass filter is configured to remove ions having energies of less than the energy value of the energy peak of the beam minus 6 eV.

4. The focused ion beam system of claim 1 in which the high-pass filter is configured to remove ions having energies of less than the energy value of the energy peak of the beam minus 10 eV.

5. The focused ion beam system of claim 1 in which the high-pass filter comprises an electrostatic deflector.

6. The focused ion beam system of claim 5 in which the high-pass filter comprises at least four electrostatic deflectors.

7. The focused ion beam system of claim 5 in which the high-pass filter comprises a hemispherical filter.

8. The focused ion beam system of claim 1 in which the high-pass filter comprises a magnetic deflector.

9. The focused ion beam system of claim 1 in which the high-pass filter comprises a band pass filter, the pass band passing essentially all ions having energies above the energy peak of the beam.

10. The focused ion beam system of claim 1 in which the high-pass filter is configured to block more than 2% of ions having energy less than the peak value and less than 1% of the ions having energies above the peak value,.

11. The focused ion beam system of claim 1 in which the high-pass filter is configured to block more than 3% of ions having energy less than the peak value, and less than 2% of the ions having energies above the peak value,.

12. A focused ion beam system for processing a sample, comprising:
    a source of ions, the source producing ions having different energies and forming the ions into a beam, the energies centered around a peak energy and having a low energy tail;
    an energy filter for blocking ions having less energy than a specified energy value that is below the energy peak, the energy filter being configured to preferentially block ions in the low energy ion tail and pass ions having energies above the energy peak;
    a deflector for positioning the ion beam on the sample; and
    a focusing lens for focusing the ions onto a submicron spot on the sample.

13. The focused ion beam system of claim 12 in which said energy filter is configured to block more than 2% of the ions below the beam peak energy and less than 1% of the ions above the beam peak.

14. The focused ion beam system of claim 12 in which said energy filter is configured to block more than 1.5% of the ions below the beam peak energy and less than 0.5% of the ions above the beam peak.

15. The focused ion beam system of claim 12 in which the energy filter is configured to pass ions having energies in an energy range that is not symmetrical about the peak energy of the beam, the energy range extending further above the energy peak than below the energy peak.

16. A method of improving the beam quality of a focused ion beam system, comprising: emitting ions from an ion source and forming the ions into a beam, the distribution of ion energies in the beam being unsymmetrical about a peak value, the distribution including more ions having energy values below the peak energy value than ions having energies above the peak energy value;
    filtering a greater number of ions having energies below the peak value than ions having energies above the peak value, including passing essentially all ions in the beam having energies above the peak value while blocking ions having energies that deviate by a specified amount below the peak energy value; and
    focusing the remaining ions onto a sample.

17. The method of claim 16 in which filtering ions includes deflecting the ions multiple times, the ions having energies below the specified deviation from the energy peak being deflected insufficiently to pass a barrier.

18. The method of claim 16 in which filtering ions includes filtering ions having energies of less than the peak energy minus 4 eV.

19. The method of claim 16 in which filtering ions includes filtering ions having energies of less the peak energy minus 6 eV.

* * * * *